United States Patent [19]
Pham

[11] Patent Number: 5,127,036
[45] Date of Patent: Jun. 30, 1992

[54] FIFTY PERCENT DUTY CYCLE DIVIDED-BY-M COUNTER

[75] Inventor: Nam H. Pham, Baldwin Park, Calif.

[73] Assignee: Racal Data Communications Inc., Sunrise, Fla.

[21] Appl. No.: 677,913

[22] Filed: Apr. 1, 1991

[51] Int. Cl.⁵ .......................................... H03K 21/02
[52] U.S. Cl. ........................................ 377/47; 377/48; 377/55; 328/55
[58] Field of Search ............... 377/47, 48, 55; 328/55

[56] References Cited

U.S. PATENT DOCUMENTS

| | | | |
|---|---|---|---|
| 3,873,815 | 3/1975 | Summers | 235/150.3 |
| 4,475,086 | 10/1984 | Allen | 328/112 |
| 4,623,846 | 11/1986 | LaMacchia | 328/61 |
| 4,715,052 | 12/1987 | Stambaugh | 377/47 |
| 4,731,828 | 3/1988 | Basehore | 379/382 |
| 4,755,704 | 7/1988 | Flora et al. | 328/55 |
| 4,799,022 | 1/1989 | Skierszkan | 328/20 |
| 4,891,825 | 1/1990 | Hansen | 377/52 |
| 4,912,564 | 3/1990 | Saitoh | 328/55 |
| 4,942,595 | 7/1990 | Baca | 377/48 |
| 5,049,766 | 9/1991 | van Driest et al. | 328/55 |
| 5,062,128 | 10/1991 | Katsuragi et al. | 377/55 |

*Primary Examiner*—Stanley D. Miller
*Assistant Examiner*—Scott A. Ouellette
*Attorney, Agent, or Firm*—William A. Newton

[57] ABSTRACT

Disclosed is a divide-by-m counter for generating an ouptut clock signal having a fifty percent duty cycle from a higher frequency source clock signal having m cycles for each single cycle of the output clock signal and wherein m may be an odd or even integer number, the divide-by-m counter including a modulo binary counter for counting up to a predetermined number, circuitry for presetting the modulo binary counter by another predetermined number, counter clock selector for providing a counter clock signal to the modulo binary counter which, when m is odd, will be either an non-inverted source clock or an inverted source clock based upon the occurrence of either the HIGH or LOW intervals of the output clock, and interval defining circuitry for defining the beginning of such HIGH and LOW intervals of the output clock based upon the occurrence of a ripple carry pulse from the modulo binary counter.

10 Claims, 3 Drawing Sheets

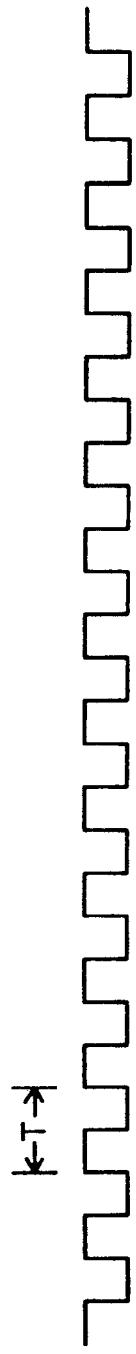
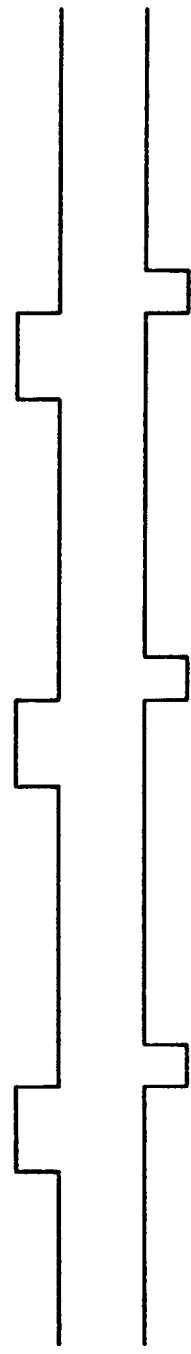
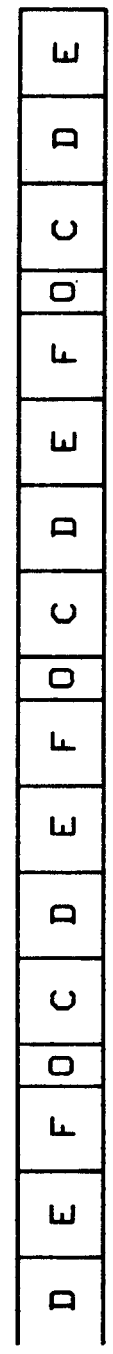
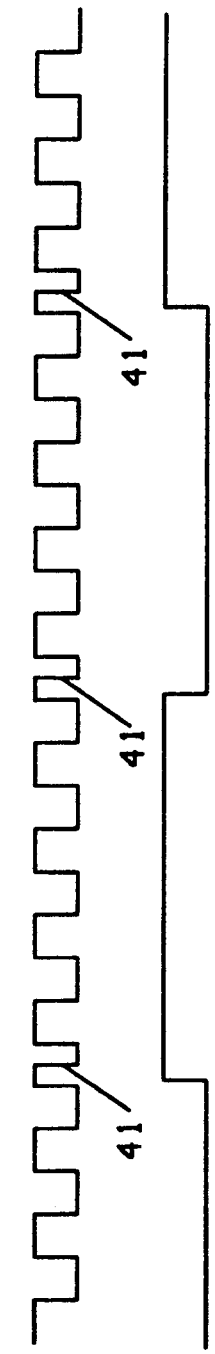
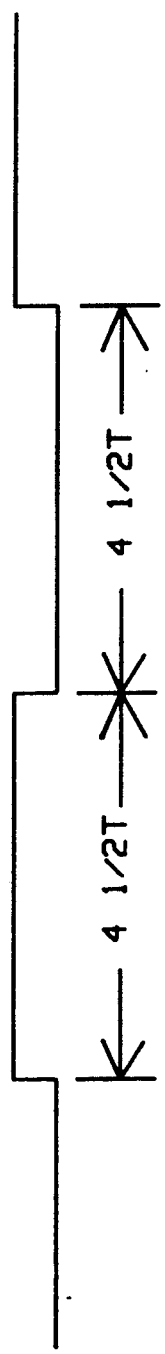
FIG.2A FIG.2B FIG.2C FIG.2D FIG.2E FIG.2F FIG.2G

FIFTY PERCENT DUTY CYCLE DIVIDED-BY-M COUNTER

BACKGROUND OF THE INVENTION

1. Field of the Invention

The present invention relates to divide-by-m counters for generating a lower frequency output clock signal from a higher frequency source clock signal.

2. Description of Prior Art

Most of the prior art counter schemes only give a fifty per cent duty cycle waveform if the number of the count m (number of cycles of the source clock to a single cycle of the output clock) is an even number. If the count m is an odd number, typically an output clock signal will have a high state that will be $(m+1)/2$ counts and a low state that will have $(m-1)/2$ counts. Those designs that accommodate an odd numbered m and also have a fifty percent duty cycle, have unnecessary complexity and delays.

SUMMARY OF THE INVENTION

The present invention is directed toward an improved divide-by-m counter for generating from a source clock signal an output clock signal having a fifty percent duty cycle, where the source clock signal has m cycles for each single cycle of the output clock signal and where m may be an odd or even integer. Each cycle of the output clock signal, with its fifty percent duty cycle, is defined to have a high interval and a low interval of equal duration. The divide-by-m counter includes a modulo binary counter for counting up to a n-bit binary number N and for providing a ripple carry pulse when reaching the number N. A counter preset means is provided for setting the binary counter with a counter prescaler number. A counter clock selector means is provided with the non-inverted source clock signal from a clock source and includes inverter means for generating an inverted version of the source clock signal. The counter clock selector means further includes means for selecting when m is odd, one of the inverted or non-inverted source clock signals during the high interval of the output clock signal and for selecting a different one of the inverted or non-inverted source clock signals during the low interval of the output clock signal. Interval defining means, in response to the ripple carry signal from the modulo binary counter, a) provides a switching signal for enabling the counter clock selector means to switch between the inverted and non-inverted source clock signal and b) defines the beginning and the end of the high and low intervals of the output clock signal, such intervals having a duration defined by m/2 that includes a partial fraction of ½ when m is an odd number.

With the duration of each cycle of the source clock signal being specified as 1T, the counter clock selector means provides a counter clock signal to the modulo binary counter that has a cycle, occurring immediately after the ripple carry pulse, that has a duration of 1T when the number m is even and a duration of ½T when the number m is odd. In the later case, the compression of the cycle of the counter clock signal is caused by the above described switching between inverted and non-inverted source clock signals. The counter clock cycle of ½T for an odd number m causes the ripple carry pulse to occur upon an integer number T plus ½T, which in turn allows for the intervals of the output clock signal to have a duration of an integer number T plus ½T.

BRIEF DESCRIPTION OF THE DRAWINGS

Further objects and advantages of the present invention will become apparent and the following description proceeds, taken in conjunction with the accompanying drawings in which:

FIG. 2A is a timing diagram for the source clock.

FIG. 2B is a timing diagram for the ripple carry pulses for m=9.

FIG. 2C is a timing diagram for the load counter signal for m=9.

FIG. 2D is a timing diagram for the counter output for m=9.

FIG. 2E is a timing diagram of a counter clock for m=9.

FIG. 2F is a timing diagram of the selector or switch signal for m=9.

FIG. 2G is a timing diagram for the output clock for m=9.

DETAILED DESCRIPTION OF PREFERRED EMBODIMENT

Figure 1:
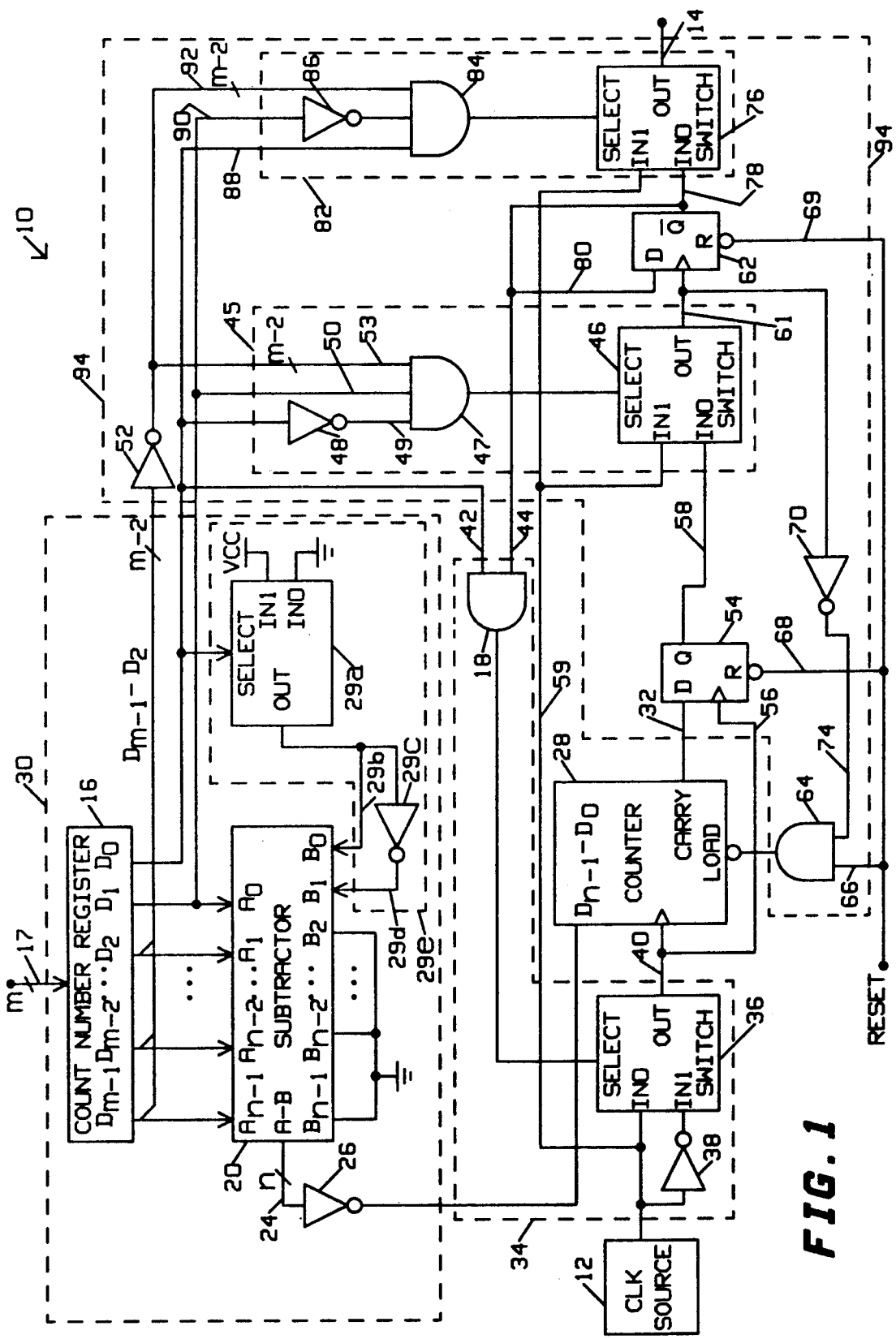
FIG. 1 is a schematic diagram of the divide-by-m counter of the present invention.

Referring to FIG. 1, disclosed is a counter, generally identified by the reference numeral 10, which is a divide-by-m counter having a 50% duty cycle. This counter 10 is used to derive from a clock source 12 a lower frequency output clock provided over line 14, regardless whether the count number m is odd or even.

The counter 10 includes a counter number register 16 which receives and stores the user-selected, programmable, count number m provided over line 17. In a conventional manner, the counter number m is used to specify the number of cycles of a source clock from the clock source 12 for each cycle of the output clock. For example, in the illustrative embodiment of FIG. 1 described hereinafter, the counter number m is selected to be the odd integer 9, meaning that there is one cycle of the output clock for every 9 cycles of source clock. However, the counter 10 of the present invention allows the counter number m to be even or odd, and still allows for a 50% duty cycle for the output clock. As will be more apparent hereinafter, there are frequency limitations to the counter 10 caused by propagation delays of the circuitry. Even so, frequencies can be relatively high, e.g., the source clock having a frequency of 16.128 MHz, the output clock having a frequency of 256 KHz, and m having a value of 63. This illustrative example is intended only to illustrate one example of high frequencies and is not intended as an indication of the upper frequency limitations of counter 10.

The counter number register 16 is shown as having outputs $D_{m-1}$ through $D_0$, or one output for each binary digit of the binary count number m. Although m=9 (in its decimal form) in illustrative example, the register can be expanded to m=$2^{17}-1$ or higher. The output of register 16 providing the least significant bit, $D_0$, of the number m is coupled to one of two inputs of an AND gate 18. The other outputs ($D_{m-1}$ through $D_1$) of the register 16 provide the other bits of the binary number m (with $D_{m-1}$ being the most significant bit) to $A_{n-1}$ through $A_0$ inputs of a subtractor 20. The n outputs of subtractor 20 are connected via a set of lines 24 to the inputs of inverters 26. The set of lines 24 include n lines designated in FIG. 1 by using conventional technique of a slash and "n". The outputs of inverters 26 (one for each of the n lines) are coupled to the n data inputs ($D_{n-1}$ to $D_0$) of a synchronous, n-bit, binary counter 28. The binary counter 28, for example, typically would be of the type identified by part number 74161 with two cascaded 4 bit counters having carry look-ahead and the inputs preset via the "load" input of counter 28.

Referring to FIG. 1, a switch or multiplexer 29a receives a select signal at its "select" input, such select signal comprising the odd or even determining bit $D_0$. The switch 29a has an input "IN1" connected to HIGH ($V_{cc}$) and an input "IN0" connected to LOW (ground). The output of the switch 29a is connected to the "$B_0$" input of the subtractor 20 by way of line 29b and to an inverter 29c with the inverted signal being fed to the "$B_1$" input of the subtractor 20 by way of line 29d. This circuit, which is generally designated by the numeral 29e, is used to select the correct value of $B_0$ and $B_1$, which is the value to be subtracted by the subtractor 20. The need for different subtracted values will be explained hereinafter. When m is odd, $D_0=1$ and the output of switch 29a will be equal to IN1 or HIGH. In this case, $B_0$ will be HIGH, i.e., equal to the output of switch 29a, and B will be LOW, i.e., equal to the inversion of $B_0$. $B_{n-1}$ through $B_0$ will have the value of 1. When m is even, $D_0=0$ and the output of switch 29a will be equal to IN0 or LOW. In this case, $B_0$ will be LOW and B1 will be HIGH, with $B_{n-1}$ through $B_0$ having the value of 2.

Referring to the timing diagrams of FIGS. 2A through 2G, the waveforms are shown for the illustrative example where m=9. The source clock from the original clock source 12 is shown in FIG. 2A. The output clock is shown in FIG. 2G having one cycle for nine cycles of the source clock, with each cycle of the source clock being designated by the period T in FIG. 2A. In FIG. 2G, with one cycle of the output clock being designated as having a period of 9T, it is necessary for the output clock to transition from its high level ("1" state) to its low level ("0" state) at $4\frac{1}{2}$T as shown, i.e., at m/2 T.

Referring back to FIG. 1, to provide for the above described transition, the counter 28 must be preset in the manner hereinafter described. However, in presetting the counter 28 by providing inputs to its data terminals $D_{n-1}$ through $D_0$, the number of delay cycles of the ripple carry of the counter 28 must be taken into account. To preset the counter 28 the above described circuitry will perform the following mathematical operations. First, a term "inverted prescaler p" is defined to be:

$$p = \left[ \frac{(m-1)}{2} - 1 \right]$$ Equation 1 for odd number m, and $$p = \left( \frac{m}{2} - 2 \right)$$ Equation 2 for even number m. These formulas only work when m≧3, and additional circuitry, to be discussed hereinafter, is provided to accommodate the situation when m=1 or 2.

In the illustrative example, where m=9, using Equation 1, p=3. In the above equations the subtracted terms take in to account the delay of the ripple carry of the counter 28 and the nature of digital counter, as will be discussed more hereinafter. As will be explained hereinafter, the delay of ripple carry refers to the length of the counter clock (shown in FIG. 2E) cycle occurring immediately after the ripple carry pulse (shown in FIG. 2B), such cycle lasting for $\frac{1}{2}$T when m is odd and 1T when m is even.

The counter 28 can count up to a maximum of N (maximum n-bit number). Hence, the counter 28 needs to be preset via its data inputs $D_{n-1}$ through $D_0$ to the counter prescaler M, as follows:

$$M = N - p$$ Equation 3

The counter prescaler M is the number to which the counter 28 is preset so that, as the counter 28 counts up by p from M, it will reach its maximum count of N. Hence, as p increases by 1, the counter 28 will be incremented by one less before reaching N, when the counter 28 will thereafter be reset to zero.

Referring back to FIG. 1, it will be shown how the previously described circuitry implements the above described mathematics. From the output of register 16, the least significant bit, $D_0$, is used to determine whether the count number m is odd or even. If the bit $D_0$ is 1, then the counter number m is odd and if it is 0, then the count number m is even. Additionally, in dropping the last digit of number m by providing only digits $D_{m-1}$ to $D_1$, to the subtractor 20, this is equivalent to dividing m by 2 for even numbers and subtracting one and dividing by 2 for odd numbers. In the illustrative example, the digits of binary equivalent to 4 (9/2=4.—) are provided in parallel from the $D_{m-1}$ to $D_1$ outputs of the register 16 to the $A_{n-1}$ through $A_0$ inputs of subtractor 20, where n=m−1. By dropping the last significant bit of any odd number m, this is equivalent to performing the following mathematical operation (as illustrated in its decimal equivalents) in the illustrative case:

$$\frac{m-1}{2} = 4$$

FIG. 2D shows the output of counter 28. Each count of the counter 28 is provided for a duration of 1T. The ripple delay (shown by a "0") is $\frac{1}{2}$T. In calculating p, this mathematical operation of dropping the last bit eliminates the delay of $\frac{1}{2}$T. Thereafter, to take in the mathematical nature of a digital counter, an addition 1 must be subtracted by the subtractor 20 to calculate p, which is "3" in the illustrative case. With p=3, then the total number of counts between the beginning value (e.g., M=12) and the end value (e.g., N=2⁴-1=15) is 4. In other words, the counter 28 will count 12, 13, 14, and 15, before resetting to 0. Therefore, with both even and odd m's, it is necessary to subtract 1 in calculating p to compensate for this, such correction being needed in addition to the correction for the ripple carry. When m is even, then two factors result in the subtractor 20 having to subtract "2" instead of "1" as with an even m. First, the division process does not result in the loss of a fraction. For example, dropping the least significant bit of even number m=10 is equivalent to performing the following mathematical operation:

$$\frac{m}{2} = 5$$

Secondly, the carry ripple delay has a duration of 1T instead of ½T as with odd numbers. Hence, "2" must be subtracted by the subtractor 20. In the case where m=10, p=3.

The above described operation results in the calculation of the inverted prescaler p. Thereafter, M is obtained by inverting p through inverters 26.

In the above example with m=9 the above described circuitry performs the following calculations:

| Step 1 | 00001001 (m) |
|---|---|
| Step 2 | 00000100 (m/2, dropping any fraction) |
| Step 3 | 00000011 (subtract one) |
| Step 4 | 11111100 (M = N − p) |

Referring to FIG. 1, in the above described step 1, m is loaded into register 16. In step 2, by dropping the last digit of m, m is divided by 2, and in the case of an odd number m, the fraction is dropped. In step 3, 1 is subtracted in subtractor 20. In step 4, the inverted prescaler p is inverted by inverters 26 to provide the prescaler M. The above process also could be implemented in software, eliminating the need for the subtractor 20, while implementing the divide-by-two operations merely by shifting m to the right by one digit.

Referring to FIG. 1, the count number register 16, the subtractor 20 and the inverters 26 (or its software implementation) define a counter preset means 30 for presetting the modulo binary counter 28 so that at the end of its count, just prior to the counter 28 being reset to zero, the counter 28 generates a ripple carry as shown in FIG. 2B. More specifically, the counter 28 generates at its ripple "carry" output over line 32 with the waveform shown in FIG. 2B. For reasons that will become more apparent hereinafter, this ripple carry waveform has a period of 4½ T with its high state, the ripple carry pulse, lasting 1T. Continuing on with the above described step by step description, this illustrative 8 bit modulo counter 28, with m=9, would increment its output through the following sequence:

| Step 5 | 11111100 | (M as loaded) = (C) | (1T) |
|---|---|---|---|
| Step 6 | 11111101 | (incremented by 1) = (D) | (1T) |
| Step 7 | 11111110 | (incremented by 2) = (E) | (1T) |
| Step 8 | 11111111 | (incremented by 3) = (F) | (1T) |

-continued

| Step 9 | 00000000 | (reset to zero) = (0) | (½T) |
|---|---|---|---|
| Step 10 | 11111100 | (M as loaded) = (C) | (1T) |

In FIG. 2D and the above steps, the counter 28 binary output is shown by letters C, D, E and F, and when it is reset, it is shown by a 0. The duration of steps 5 through 10 are shown above in multiples of the period T. As inherent in the design of the conventional binary counter 28, the occurrence of the ripple carry pulse is coincident with the occurrence of the last counter output F, occurring just prior to the counter 28 being reset to zero.

FIGS. 3A through 3F show the timing diagrams for a case when m is even and more specifically when m=10. The previously described steps for the divide-by-9 case are hereinafter repeated for the illustrative divide-by-10 case as follows:

| Step 1: | 00001010 | (m) | |
|---|---|---|---|
| Step 2: | 00000101 | (m/2) | |
| Step 3: | 00000011 | (subtract 2) | |
| Step 4: | 11111100 | (M = N − p) | |
| Step 5: | 11111100 | (M as loaded) = (C) | (1T) |
| Step 6: | 11111101 | (incremented by 1) = (D) | (1T) |
| Step 7: | 11111110 | (incremented by 1) = (E) | (1T) |
| Step 8: | 11111111 | (incremented by 1) = (F) | (1T) |
| Step 9: | 00000000 | (incremented by 1) = (0) | (1T) |
| Step 10: | 11111001 | (M as loaded) = (C) | (1T) |

Figure 3A:
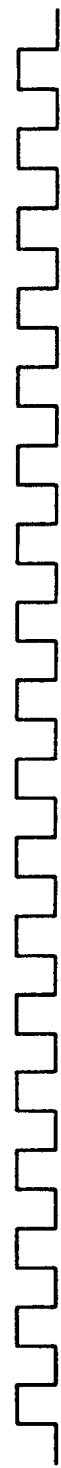
FIG. 3A is a timing diagram for the source clock.
Figure 3B:
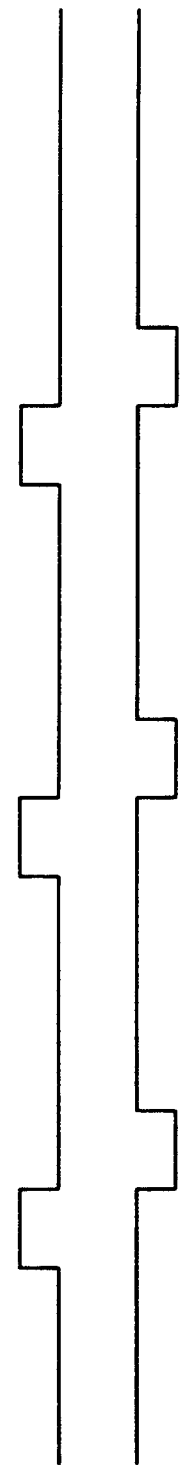
FIG. 3B is a timing diagram for the ripple carry pulses for m=10.
Figure 3C:
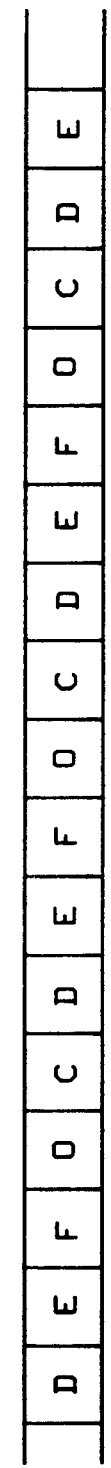
FIG. 3C is a timing diagram for the load counter signal for m=10.
Figure 3D:
FIG. 3D is a timing diagram for the counter output for m=10.
Figure 3E:
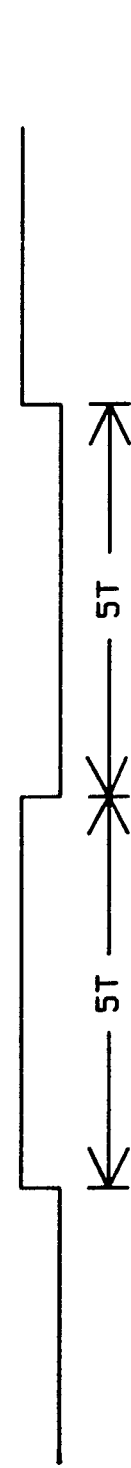
FIG. 3E is a timing diagram of a counter clock for m=10.
Figure 3F:
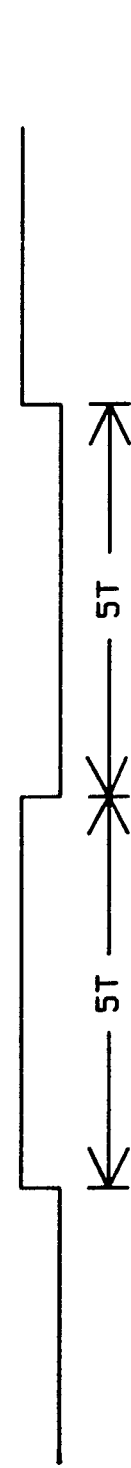
FIG. 3F is a timing diagram of the selector or switch signal for m=10.

As shown in FIG. 3D, the duration of the counter clock cycle occurring immediately after the ripple carry pulse (shown in FIG. 3B) is 1T when m is even. The output clock of FIG. 3F now has two half cycles with each having a duration of 5T.

Referring to FIG. 1, a first clock selector means 34 (i.e., counter clock selector means) is shown for selecting the appropriate clock for the counter 28, depending upon whether "m" is even or odd. The clock selector means 34 includes the AND gate 18, a multiplexer or switch 36 and an inverter 38. The switch 36 has three inputs: a first input designated "0" which is coupled directly to the clock source 12, a second input designated by "1" which is coupled to the clock source 12 through the inverter 38, and a third input designated as "s" which causes the switch 36 to select one of the inputs "0" or "1", i.e., it causes the switch 36 to receive and provide as an output over line 40 either the source clock waveform of FIG. 2A from the input "0" or an inverted source clock waveform from the input "1". The output of switch 36 is provided to the clock input of the counter 28 over the line 40. The output of AND gate 18 provides the select signal to the switch 36. The AND gate 18 has two inputs. The first input is provided over line 42 and comprises the least significant bit D₀ which determines whether m is odd or even, as previously described. The second input is provided over line 44 and is the output clock at line 14 being fed back to the AND gate 18. The select signal at the output of the AND gate 18 is shown by the waveform of FIG. 2F.

In operation, the clock selector means 34 operates as follows. When "m" is odd, the AND gate 18 will receive a "1" (HIGH state) over line 42. When the output clock as shown in FIG. 2G is "1" (HIGH state), gate 18 will receive a "1" at its other input, causing the output, i.e., select signal, of the AND gate 18 to be "1" (HIGH state) as shown in FIG. 2F. In other words, the two inputs of the AND gate will be HIGH, enabling the AND gate 18 to provide a HIGH output that causes the switch 36 to select the inverted source clock at its "1" input. When the output clock waveform of FIG. 2G is LOW, the AND gates 18 output will be LOW, causing the switch 36 to select the non-inverted source clock at its "0" input. As the output clock waveform of FIG. 2G transitions from its LOW interval to its HIGH interval, the transitions 41 occur in the counter clock of FIG. 2E, i.e., it switches from the non-inverted source clock to the inverted source clock or vice versa. When "m" is even, the AND gate 18 will always have a LOW input via line 42; hence, the switch 36 will always provide a LOW select signal to select the non-inverted source clock, regardless of the state of its other input (i.e., regardless of the level of the output clock). In other words, no switching of switch 36 occurs between non-inverted and inverted source clocks, i.e., the source clock waveform of FIG. 3A is identical to the counter clock waveform of FIG. 3E. Since the select signal of AND gate 18 is continuously LOW when m is even, it is not shown in the timing diagrams of FIGS. 3A through 3F.

With reference to the source clock waveform of FIG. 2A, when m is an even integer ("even number mode"), the rising edge is always used to clock the counter 28. Again with reference to the waveform of FIG. 2A, when "m" is an odd integer ("odd number mode"), the rising edge is used to clock the LOW state interval of the output clock. However, the falling edge of the source clock waveform of FIG. 2A (i.e., the rising edge of the inverted source clock waveform) is used to clock the counter 28 during the HIGH state interval of the output clock. Conceptually, in the odd number mode this can be viewed as using different clock edges for clocking during the HIGH and LOW states of the output clock, with the switching of clock edges being provided by the clock selector means 34. More specifically, the clock source in one interval (be it HIGH or LOW) of the waveform 2G is inverted relative to its state in the previous and subsequent interval of the waveform 2G. With respect to waveform 2A, this transition of edges can be viewed as switching from the falling edge to the rising edge of the pulses of FIG. 2A or vice versa. The actual waveform provided to the counter 28 is shown in FIG. 2E and the switching of clock edges (switching from an inverted clock source relative to the previous one) occurs during the "0" output of the counter 28. In essence, when m is odd the effect of this edge switching process is to cause a complete cycle of the counter clock waveform of FIG. 2E to occur within ½T, instead of T in the time period during which the output of counter 28 is zero. Outside of the ½T transition period, the counter clock waveform 2E is the same as the source clock of FIG. 2A during the LOW interval of the output clock of FIG. 2G and is an inverted version of the source clock of FIG. 2A during the HIGH interval of the output clock. When m is even, there is no switching between inverted and non-inverted clock sources; hence, there is no compression of the counter clock cycle during the time the output of counter 28 is zero. In other words, in this case the cycle of the counter clock of FIG. 3E occurring after the ripple carry pulse and the "0" output of the counter 28 both have a duration of T, instead of ½T as in the case when m is odd.

Although the clock selector means 34 is shown as a switch 36 and inverter 38, other embodiments will be readily apparent to those skilled in the art, such as the use of an Exclusive OR gate. In this Exclusive OR embodiment of the clock selector means 34 (not shown in drawings), the two inputs to the Exclusive OR would be the source clock from the clock source 12 and the select signal from the AND gate 18, with the output of the Exclusive OR providing the clock to the counter 28.

Referring to FIG. 1, a second clock selector means 45 is shown which comprises a multiplexer or switch 46. An AND gate 47 is provided with a plurality of inputs. First, the least significant bit $D_0$ from register 16 is provided to an inverter 48, where the bit $D_0$ is inverted and the inverted bit is thereafter provided a first input of the AND gate 47 via line 49. The next least significant bit $D_1$ from register 16 is provided over line 50 to a second input of AND gate 47. The bits $D_{m-1}$ through $D_2$ (m − 2 bits) are provided in parallel through inverters 52 (one for each of the m − 2 lines) to the remaining inputs of the AND gate 47 via lines 53.

Referring to FIG. 1, a first D-type flip flop 54 has its clock input coupled to the output of the clock selector means 36 by way of line 56 and its data ("D") input coupled via the line 32 to the carry output of the counter 28. The "Q" output of the flip flop 54 is coupled via line 58 to the "0" input of the second switch 46. The "1" input of the switch 46 is coupled to the output of the clock source 12 to receive the source clock signal by way of line 59. The output of the switch 46 is coupled via line 61 to a clock input of a second D-type flip flop 62. Initially, an input to an AND gate 64 is set to its LOW state via line 66 and the two flip-flop 54 and 62 are set to their LOW states via lines 68 and 69, respectively. In addition to being fed to the second flip flop 62, the output of the second selector 46 is coupled to an inverter 70, which in turn provides the inverted signal to another input of AND gate 64 via line 74. The output of AND gate 64 is the load counter signal of FIG. 2C (when m is odd) and FIG. 3C (when m is even). The output of AND gate 54 will force the counter 28 to load a new value M when either RESET (line 66) or line 74 is LOW. At this time, the output of the AND gate 64 will be LOW.

The "$\overline{Q}$" output of the second flip flop 62 is provided to a third switch or multiplexer 76 via line 78 and is fed back via line 80 to its own data input and via line 44 to the input of AND gate 18. The switch 76 is part of a third clock selector means 82, which is similar to the second clock selector means 45 in construction. More specifically, the clock selector means 82 includes an AND gate 84, an inverter 86, and the switch 76. However, the bit $D_0$, unlike with the second clock selector means 45, is provided via line 88 without inversion to the AND gate 84 of the third clock selector means 82. The bit $D_1$ from line 90 is inverted by inverter 86 and then provided to an input of AND gate 84. The inverted bits $D_{m-1}$ to $D_2$ are provided over line 92 to an input of AND gate 84.

Referring to FIG. 1, there are propagation delays in flip-flop 54, switch 46, inverter 70 and AND gate 64. This delay is needed to hold the load counter signal long enough to load the prescalor value M to the counter 28. Due to the clock-to-ripple carry delay of the counter 28, the trailing edge of the ripple carry pulse of FIG. 2B just slightly lags the leading edge of the counter clock cycle of FIG. 2E during the clock reset to zero, so that flip flop 54 generates a pulse, which is inverted by inverter 70 to produce load counter waveform of FIG. 2C. The same relationship occurs when m is even.

The Equations 1 and 2 will not work when m is equal to one (1) or two (2). Although these equations are valid for m≧3, additional circuitry must be included in the counter 10 to accommodate the case when m=1 or 2. Referring to the second clock selector means 45 of FIG. 1, in the case of m=2, the bits $D_{m-1}$ to $D_2$ are LOW, but are inverted by inverters 52 prior to being fed to the inputs of AND gate 47. The bit $D_1$ is HIGH and the bit $D_0$ is LOW, but the later is inverted by inverter 48 prior to being fed to the input of AND gate 47. Hence, all the m inputs to the AND gate 47 is HIGH, which in turn, makes the output of the switch 46 be equal to input IN1, i.e., the source clock. This results in an output clock at line 14 having a frequency equal to one-half of the source clock frequency. If m is not equal to one, then the AND gate 47 is always LOW; hence, the output of switch 46 will be equal to IN0 i.e., the signal on line 58.

Referring to the third clock selector means 82, in the case of m=1, then the bits $D_{m-1}$ to $D_2$ and $D_1$ are LOW but these bits are inverted before being fed to AND gate 84. The bit $D_0$ is HIGH. Hence, when m is 1, the m inputs to the AND gate 84 is HIGH. The output of switch 76 is equal to the input IN1, i.e., the source clock. In the case where m is not 1, the output of AND gate 84 is LOW, the switch 76 has at its output the signal IN0, i.e., the signal on line 78.

Referring to FIG. 1, the output of switch 46 is used to generate the counter load signal, which in turn is used to load the prescaler M into the counter 28. In addition, the output of the switch 46 is used to clock the second flip-flop 62. Two consecutive LOW to HIGH transitions of the counter clock waveforms of FIGS. 2E and 3E define each of the load pulses of FIG. 2C and FIG. 3C, respectively. In the illustrative case when m=9, the HIGH to LOW transitions of two consecutive load pulses of FIG. 2C define the $4\frac{1}{2}$T widths of the LOW and HIGH intervals of the output clock waveform of FIG. 2G, i.e., every falling edge of each load pulse, which are $4\frac{1}{2}$T apart, trigger a transition in the output clock waveform. In the illustrative case when m=10, then each of the LOW and HIGH intervals of the output clock have a duration of 5T.

Referring to FIG. 1, the ripple carry waveform of FIG. 2B provided by the counter 28 defines a waveform with a period of $4\frac{1}{2}$T when m=9 and 5T when m=10, which are the desired durations of each of the two half cycles, i.e., HIGH and LOW intervals, of the output clock waveform of FIG. 2G for the two illustrative examples. The circuitry of flip flops 54 and 62 and associated circuitry in the m=9 case allows the $4\frac{1}{2}$T period of ripple carry waveform to cause the output clock waveform to transition from one state to another every $4\frac{1}{2}$T, thereby defining a 9T cycle with a LOW interval and a HIGH interval, each having a duration of $4\frac{1}{2}$T. When m=10, the output clock waveform has a cycle with a duration of 10T. Hence, the flip-flops 54 and 62, clock selector means 45 and 82, inverters 70 and 52, and AND GATE 64 herein defined as interval defining means 94 for generating from ripple carry waveform, an output clock waveform having LOW and HIGH intervals of the same duration as the period of the ripple carry.

In summary, when m is odd, the interval defining means 94, in response to the ripple carry pulse, provides the switching signal over line 44 which causes the counter clock selector means 34 to compress a cycle of the counter clock waveform of FIG. 2E into a period of $\frac{1}{2}$T instead of 1T, in a manner that has already been described. This compression in turn causes the counter 28 to generate the ripple carry pulse that occurs in an integer number of Ts plus $\frac{1}{2}$, e.g., $4\frac{1}{2}$T in the illustrative case where m=9. From the duration of the ripple carry pulse waveform, e.g., $4\frac{1}{2}$T, the interval defining means 94 generates HIGH and LOW intervals of the output clock to have the same duration, e.g., $4\frac{1}{2}$T. When m is even, there is no compression of a cycle of the counter clock waveform of FIG. 3E and therefore the ripple carry pulse has a duration of 1/T.

Although particular embodiments of the invention have been shown and described here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

What is claimed is:

1. A divide-by-m counter for generating an output clock signal from a source clock signal, said source clock signal having m cycles for each cycle of said output clock signal and where m may be an odd or even integer number, said output clock signal having during each cycle a high interval and a low interval of equal duration, said divide-by-m counter comprising:

clock source means for providing a non-inverted said source clock signal;

modulo binary counter for counting up to a predetermined binary number and for providing a ripple carry pulse when reaching said predetermined binary number;

counter preset means for presetting said modulo binary counter;

counter clock selector means for providing a counter clock signal to increment said modulo binary counter including means for providing an inverted said source clock signal and when m is odd said counter clock selector means being selectively operable to provide for said high and low intervals of said output clock a different one of said inverted and non-inverted source clock signals to be said counter clock signal; and interval defining means for defining the beginning and ending of said high and low intervals based upon the occurrence of said ripple carry pulse.

2. The divide-by-m counter according to claim 1, wherein said interval defining means in response to said ripple carry signal provides a switching signal, said counter clock selector means being selectively operable to provide said different one of said inverted and non-inverted source clock signals in response to said switching signal.

3. The divide-by-m counter according to claim 2, wherein, when m is even, said counter clock selector means is operable to provide for said high and low intervals of said output clock a same one of said inverted and non-inverted source clock signals to be said counter clock signal.

4. The divide -by-m counter according to claim 3, wherein the duration of each cycle of said source clock is T and said counter clock selector means provides said counter clock signal with a cycle occurring immediately after said ripple carry pulse that has a duration of one T when said number m is even and a duration of one-half T when said number m is odd.

5. The divide-by-m counter according to claim 4, wherein said counter preset means includes means for compensating for ripple carry delay of said modulo binary counter.

6. The divide-by-m counter according to claim 5, wherein said counter preset means includes calculation means for generating a prescaler number for presetting said modulo binary counter, said calculation means creating said prescaler number by removing the last binary digit from the number m and in the case of said number m being odd subtracting one therefrom and in the case of said number m being even subtracting two therefrom.

7. In a method for generating an output clock signal from a source clock signal having m cycles for each cycle of the output clock signal and where m may be even or odd and said output clock signal has during each cycle a high interval and a low interval of equal duration, the steps of said method comprising:
generating a source clock signal defining a non-inverted source clock signal;
inverting said source clock signal to provide an inverted source clock signal;
presetting a binary counter with a binary number M, incrementing the binary counter with a counter clock signal from the binary number M to a binary number N, and generating a ripple carry pulse from the binary counter when the binary counter has been incremented to the binary number N;
using the occurrence of the ripple carry pulse to define the beginning and ending of the high and low intervals of the output clock signal;
selecting one of the inverted and non-inverted source clock signals to be the counter clock signal;
switching when m is odd to a different one of the inverted and non-inverted source clock signals upon the occurrence of the beginning of each of the high and low intervals.

8. In the method according to claim 7, further comprising maintaining when m is even the same one of the inverted and non-inverted source clock signals for both the high and low intervals.

9. In the method according to claim 8, wherein said step of presetting the binary counter includes compensating for the ripple carry delay of the binary counter.

10. In the method according to claim 9, further including resetting the binary counter to zero upon the counter reaching the binary number N.

* * * * *